United States Patent [19]
Zwicker
[11] 3,770,533
[45] Nov. 6, 1973

[54] METHOD OF PRODUCING HIGH RESOLUTION PATTERNS IN SINGLE CRYSTALS

[75] Inventor: Walter K. Zwicker, Scarborough, N.Y.
[73] Assignee: U.S. Philips Corporation, New York, N.Y.

[22] Filed: July 2, 1971
[21] Appl. No.: 159,204

[52] U.S. Cl. .................. 156/17, 156/3
[51] Int. Cl. .................. H01l 7/50
[58] Field of Search .................. 156/17

[56] References Cited
UNITED STATES PATENTS
3,506,509 4/1970 Kragness et al. .................. 156/17

OTHER PUBLICATIONS
Fabricating Shaped Aperture Holes by Leone et al. IBM Tech. Discl. Bul. Vol. 14, No. 2, July 1971, p. 417, 418.
Cumulative Solid State Abstracts

*Primary Examiner*—Jacob H. Steinberg
*Attorney*—Frank R. Trifari

[57] ABSTRACT

A method of producing by etching, high resolution patterns in a single metal or metalloid crystal by electrolytic displacement of portions of the metal or metalloid crystal by a different metal through an apertured mask and subsequent removal of the different metals.

6 Claims, 3 Drawing Figures

METHOD OF PRODUCING HIGH RESOLUTION PATTERNS IN SINGLE CRYSTALS

Figures 1A, 1B, 1C:
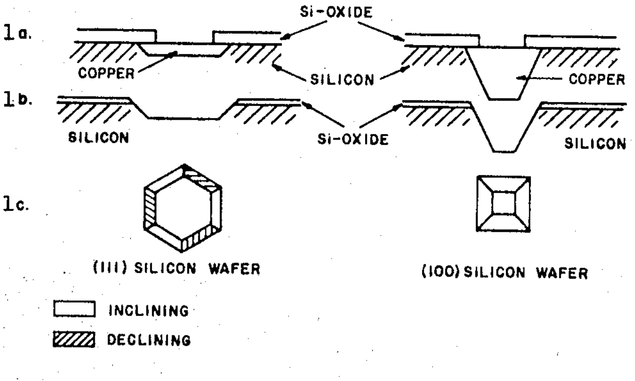

In copending U.S. Pat. application Ser. No. 141,692, filed May 10, 1971 a method is given for growing single crystals or arrays thereof of an electrically conductive material on an electrically conductive or semi-conductive substrate.

In this method a substrate such as silicon is first coated with an insulating layer such as silicon dioxide or aluminum oxide. Holes of desired size and according to a desired geometry are then produced in the insulating layer by mechanically piercing the insulating layer or by selective etching through use of standard photoresistant techniques. Then the crystal is treated in a bath with a solution of a metal salt the half-cell potential of which, relative to the surface of the substrate surface, is less than that required to deposit metal from the solution.

By this means, crystals of a metal such as copper or gold are grown through the holes on the substrate.

According to the invention in the instant case, I have now found that the growth of the metal crystals can be an anisotropic growth that undercuts the oxide masking layer in certain crystallographic preferred directions. Further, I have found that by properly orienting the holes in the oxide layer mask and subsequently removing the metal crystal growth, it is possible to obtain an array of holes or grooves of specific geometry in the substrate.

Thus by the method of my invention I can produce grooves or holes in the substrate in the form of triangles, squares or hexagons of a diameter as small as 3 to 4 microns depending upon the crystallographic orientation and shape of the hole in the mask the crystallographic orientation of the substrate and the type of etchant.

Generally, the method of my invention involves the following steps:

1. A non-conductive mask of a suitable composition and thickness is deposited on the top of the polished surface of a metal or semiconductive single crystal, and positioned in the desired crystallographic direction.
2. An array of holes of desired geometry, aligned with a desired crystallographic direction of the substrate, is etched through the mask by a standard photoresist technique.
3. The thus coated crystal is then treated with a solution containing metal ions which are able to displace atoms of the substrate preferentially in certain crystallographic directions while undercutting the mask. By use of a transparent mask, progress of this step can be observed and halted when the desired geometry is reached.
4. The resultant metal islands in the substrate are then removed by a preferential etching technique.
5. The mask can then be removed, if desired either partially or completely by an additional preferential etching technique.

The invention will now be described in greater detail with reference to the following example which is illustrative of forming an array of hexagonal holes in a semiconductive silicon substrate. However, the method disclosed therein with immaterial variations may be used to form grooves or holes of desired geometries in other semiconductive or metallic substrates.

EXAMPLE

A phosphorus doped silicon crystal is cut and polished in the (111) direction. The silicon wafer is thus thermally oxidized to form a silicon oxide mask of 1 micron thick by heating in a wet oxygen atmosphere at a temperature of 1,100° C for 6 ½ hours. An array of holes of $8\mu$ diameter with a center to center distance of $20\mu$ were etched through the oxide by employing a standard photoresist technique.

The crystal is then immersed in an aqueous solution of 0.5 mol of copper nitrate and 7 mols of ammonium fluoride per liter for a period of time of about 30 minutes.

As observed under the microscope, the copper displaces part of the silicon substrate and undercuts the silicon oxide mask to form hexagonal shaped islands. The copper islands are then removed by treating the sample with a 35 percent $HNO_3$ solution for 2 minutes. If desired, the silicon substrate may then be removed by etching the same with a 25 percent HF solution for 2 minutes. Microscopic examination showed the formation of an array of hexagonally shaped holes in the silicon substrate of 10 to 12 microns diameter and spaced 20 microns from each other, center to center.

Applying the method of the example to phosphorus doped silicon crystal oriented in the (100) direction and coated with a silicon oxide mask having an array of holes resulted in an array of tetragonally shaped holes in the silicon substrate.

The formation of the grooves or holes in the silicon substrate is illustrated in the drawing, FIG. 1*a* of which is a side elevation of a (111) silicon wafer and of a (100) silicon wafer after formation of the copper islands according to the example, FIG. 1*b* of which is a side elevation of the silicon wafers of FIG. 1*a* after removal of the copper islands with a selective etch and FIG. 1*c* of which is a top view of the silicon wafers corresponding to FIG. 1*b*.

Further, according to the method of the preceding example, holes or grooves of desired geometry can be formed in other elemental semi-conductive materials such as germanium, as well as metals, for example aluminum, zinc and chromium.

Besides use of copper salts in the above example, other water-soluble metal salts may be employed including silver or gold salts.

The method of the invention may be employed in many areas of semiconductor technologies, as for instance, by separating (by airspace) certain sections of integrated circuits or for micromachining of metal films or single crystals.

I claim:

1. A method of producing an array of holes or grooves of a desired geometry in a semiconductive crystal substrate, said method comprising the steps, forming an electrically insulating mask on said substrate, forming an array of holes or grooves in said mask aligned according to a desired crystallographic direction of said substrate, then treating said masked substrate with a solution of copper ions capable of displacing atoms of the substrate anistropically while being inert to the mask and fluoride ions thus forming copper islands on said substrate corresponding to the anisotropically displaced ions of the substrate and then treating said substrate with a preferential etch solution capable of preferentially removing said copper islands from said substrate while being inert to said substrate thereby forming grooves or holes of a desired crystallographic direction in said crystal substrate.

2. The method of claim 1 wherein the substrate is a semiconductive silicon crystal.

3. The method of claim 1 wherein the electrically insulating mask is removed by a preferential etch after the formation of the grooves or holes in the substrate.

4. The method of claim 1 wherein the substrate is a semiconductive germanium crystal.

5. The method of claim 2 wherein the mask has apertures oriented in the (111) crystallographic direction of the substrate and the resultant holes or grooves in the substrate are hexagonally shaped.

6. The method of claim 2 wherein the mask has apertures oriented in the (100) crystallographic direction of the substrate and the resultant holes or grooves in the substrate are tetragonal shaped.

* * * * *